(12) United States Patent
Li et al.

(10) Patent No.: US 11,960,118 B2
(45) Date of Patent: Apr. 16, 2024

(54) RELATING TO PHOTONIC INTEGRATED CIRCUITS

(71) Applicant: ADVANCED MICRO FOUNDRY PTE. LTD., Singapore (SG)

(72) Inventors: Chao Li, Singapore (SG); Patrick Guo-Qiang Lo, Singapore (SG)

(73) Assignee: ADVANCED MICRO FOUNDRY PTE. LTD., Singapore (SG)

( * ) Notice: Subject to any disclaimer, the term of this patent is extended or adjusted under 35 U.S.C. 154(b) by 279 days.

(21) Appl. No.: 17/602,550

(22) PCT Filed: May 27, 2020

(86) PCT No.: PCT/SG2020/050309
§ 371 (c)(1),
(2) Date: Oct. 8, 2021

(87) PCT Pub. No.: WO2020/242382
PCT Pub. Date: Dec. 3, 2020

(65) Prior Publication Data
US 2022/0187538 A1    Jun. 16, 2022

(30) Foreign Application Priority Data
May 27, 2019    (SG) .................. 10201904770S (51) Int. Cl.
*G02B 6/42*    (2006.01)
*G02B 6/136*    (2006.01)
(Continued)

(52) U.S. Cl.
CPC .......... *G02B 6/136* (2013.01); *G02B 6/4224* (2013.01); *G02B 6/43* (2013.01); *G02B 2006/12147* (2013.01)

(58) Field of Classification Search
CPC ......... G02B 6/136; G02B 6/4224; G02B 6/43
See application file for complete search history.

(56) References Cited

U.S. PATENT DOCUMENTS 5,647,042 A * 7/1997 Ochiai ................ G02B 6/4292
385/60
2007/0153276 A1    7/2007 Blidegn
(Continued)

FOREIGN PATENT DOCUMENTS

CN    106443902 A    2/2017
CN    2018124394 A    8/2018
(Continued)

OTHER PUBLICATIONS

International Preliminary Report on Patenability for International Application No. PCT/SG2020/050309, filed May 27, 2020; Report dated Dec. 2, 2020.

(Continued)

*Primary Examiner* — Sung H Pak
*Assistant Examiner* — Hoang Q Tran
(74) *Attorney, Agent, or Firm* — Bookoff McAndrews, PLLC (57) ABSTRACT

The present invention relates of a photonic integrated and a method of fabricating a photonic integrated chip, PIC, configured for alignment and attachment of a laser diode in a predetermined position in which light from the laser diode is aligned with an input of the PIC; wherein the photonic chip comprises an asymmetric alignment assembly for receiving and aligning the laser diode in the predetermined position; and wherein the input comprises a coupler for receiving a laser beam from the laser diode in use.

16 Claims, 10 Drawing Sheets

(51) Int. Cl.
*G02B 6/43* (2006.01)
*G02B 6/12* (2006.01)

(56) References Cited

U.S. PATENT DOCUMENTS

2008/0304802 A1  12/2008  Watanabe
2015/0293299 A1  10/2015  Xu

FOREIGN PATENT DOCUMENTS

| JP | 2018124394 A | 8/2018 | |
|---|---|---|---|
| WO | 2016070186 A1 | 5/2016 | |
| WO | WO-2016070186 A1 * | 5/2016 | ............... G02B 6/24 |

OTHER PUBLICATIONS

International Search Report for International Application No. PCT/SG2020/050309, filed May 27, 2020; Report dated Aug. 17, 2020.
Response to Written Opinion of the International Searching Authority for International Application No. PCT/SG2020/050309 dated Oct. 7, 2020.
Written Opinion for International Application No. PCT/SG2020/050309, filed May 27, 2020; Report dated Aug. 17, 2020.

* cited by examiner

RELATING TO PHOTONIC INTEGRATED CIRCUITS

FIELD OF THE INVENTION

The present invention relates to improvements in or relating to photonic integrated circuits, particularly, but not exclusively to integration of a light source on a photonic integrated circuit.

BACKGROUND

Photonic Integrated Circuits (PICs) come in many different forms and integrate one or more photonic functions operating in at optical wavelengths. PICs are typically made from materials which have appropriate optical properties for the intended function of the PIC.

One such application of PIC is the integration of a light source, such as a laser diode with other circuitry on for example a silicon waveguide. These types of application exhibit certain factors which limit the deployment of silicon PICs. Whilst PICs can be based on silicon, there is generally a lack of silicon light sources. This has led to hybrid integration or bonding a hybrid III-V laser diode on a silicon substrate. However, CMOS and III-V process integration are not a trivial task. As a result, hybrid integration of an external light source on the silicon photonic circuit using assembly techniques is required. This which is an immense challenge in packaging. In addition, the repeatability of bonding processes and device performance provide further problems.

A number of solutions have been proposed, but these fail to solve many of the problems. On example is a vertical approach using a sub mount such as is described in U.S. Pat. No. 8,168,939. This suffers from a number of disadvantages. For example, extra sub-mount and discrete components (such as lens and isolator) are required. There is a low coupling efficiency compared with other potential systems and a complex coupled flip-chip bonding process for the laser diode and the sub-mount.

An object of the present invention is to overcome at least some of the problems in the prior art.

A further aim is to provide a low loss lateral light source integration on silicon photonic chips using bonding and wire bonding techniques with alignment accuracy enhancement, which can be fabricated in a simple manner.

The embodiments described below are not limited to implementations which solve any or all of the disadvantages of the prior art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the present invention there is provided a photonic integrated chip, PIC, configured for alignment and attachment of a laser diode in a predetermined position in which light from the laser diode is aligned with an input of the PIC; wherein the photonic chip comprises an asymmetric alignment assembly for receiving and aligning the laser diode in the predetermined position; and wherein the input comprises a coupler for receiving a laser beam from the laser diode in use.

Preferably, the asymmetric alignment arrangement comprises a plurality of alignment keys configured to align the attachment of the laser diode in the predetermined position.

Preferably, at least one pair of alignment keys are asymmetric relative to one another.

Preferably, the pair of alignment keys are elongate and run along a direction substantially parallel to the laser beam in use.

Preferably, the pair of alignment keys include a gap between them defining a channel through which the laser waveguide can be aligned.

Preferably, the gap includes a central region having a uniform profile and two sections at either end, each having a respective first irregular profile and second irregular profile; and wherein the first irregular profile of one of the pair is juxtaposed to the second irregular profile of the other of the pair.

Preferably, the alignment assembly includes a second alignment element.

Preferably, the second alignment element include a plurality of substantially square cross section columns arranged in a predetermined shape through which a laser beam may pass in use.

Preferably, there are four columns arranged at the four corners of a substantially square predetermined shape, wherein the columns are separated by gaps there between and wherein the inward facing walls include an third irregular profile.

Preferably, the or each irregular profile includes a Vernier scale to enable positioning of the laser diode in the predetermined position.

Preferably, the asymmetrical alignment assembly includes one or more stoppers which have a predetermined vertical height for positioning the laser diode relative to the PIC.

Preferably, the coupler is a suspended coupler.

Preferably, the suspended coupler includes a suspended oxide waveguide and a silicon nano-taper.

Preferably, the suspended coupler comprising a large input facet for the suspended coupler in order to enhance the alignment tolerance when coupling to the laser diode.

Preferably, the suspended coupler is isolated from the chip by one or more air-isolation trenches formed by removing the adjacent oxide layer and underlying substrate silicon.

Preferably, one or more oxide arms 910 are formed to provide a mechanical support for the suspended coupler.

Preferably, the silicon nano-taper is designed to couple the light inside oxide waveguide to silicon photonic circuit.

Preferably, the coupler includes a tilted face for receiving a laser beam in use.

Preferably, the tilted face is angled in a vertical direction and a lateral direction.

Preferably, including a laser diode in the predetermined position.

According to a further aspect of the present invention there is provided a method of fabricating a photonic integrated chip, PIC, adapted to receive a laser diode in a predetermined positon, the method comprising: forming a from a first material a substrate, the substrate comprising an asymmetric alignment arrangement defining the predetermined position; forming from at least one second material a chip for a function and having an a coupler for receiving a laser beam in use.

Preferably, further comprising: forming a plurality of alignment keys configured to align the attachment of the laser diode in the predetermined position.

Preferably, further comprising: forming at least one pair of alignment keys to be asymmetric relative to one another.

Preferably, further comprising: forming the pair of alignment keys as elongate elements that run along a direction substantially parallel to the laser beam in use.

Preferably, further comprising: forming the pair of alignment keys to include a gap between them defining a channel.

Preferably, further comprising: forming the gap to include a central region having a uniform profile and two sections at either end, each having a respective first irregular profile and second irregular profile; and forming the first irregular profile of one of the pair to be juxtaposed to the second irregular profile of the other of the pair.

Preferably, further comprising forming a second alignment element.

Preferably, further comprising forming the second alignment element to include a plurality of substantially square cross section columns arranged in a predetermined shape through which a laser beam may pass in use.

Preferably, further comprising forming four columns arranged at the four corners of a substantially square predetermined shape, wherein the columns are separated by gaps there between and wherein the inward facing walls include an third irregular profile.

Preferably, further comprising: forming the irregular profile to include a Vernier scale which is used to position the laser diode in the predetermined position Preferably, further comprising: forming one or more stoppers as part of the asymmetrical alignment assembly which stoppers are formed at a predetermined vertical height for positioning the laser diode relative to the PIC.

Preferably, further comprising: forming the coupler as a suspended coupler comprising the steps of: forming a suspended oxide waveguide; and forming a silicon nano-taper.

Preferably, further comprising: isolating the coupler by air-isolation trenches formed by removing a adjacent oxide layer and an underlying substrate silicon.

Preferably, further comprising: forming one or more pairs of oxide arms to provide the mechanical support for the suspended waveguide.

Preferably, further comprising: forming the coupler to include a tilted face for receiving a laser beam in use.

Preferably, further comprising: forming the tilted face angled in a vertical direction and a lateral direction.

Preferably, further comprising positioning a laser diode on the alignment arrangement to position the laser diode in the predetermined position.

Preferably, further comprising a flip chip process.

According to a further aspect of the present invention there is provided a process design kit for forming a photonic integrated chip which when processed in a chip fabrication system causes the chip fabrication system to from the photonics integrated chip of another aspect of the invention.

According to a further aspect of the present invention there is provided a computer readable storage medium having stored thereon a computer readable description of a chip that, when processed in chip fabrication system, causes chip fabrication system to manufacture a photonic integrated chip of another aspect of the invention. The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
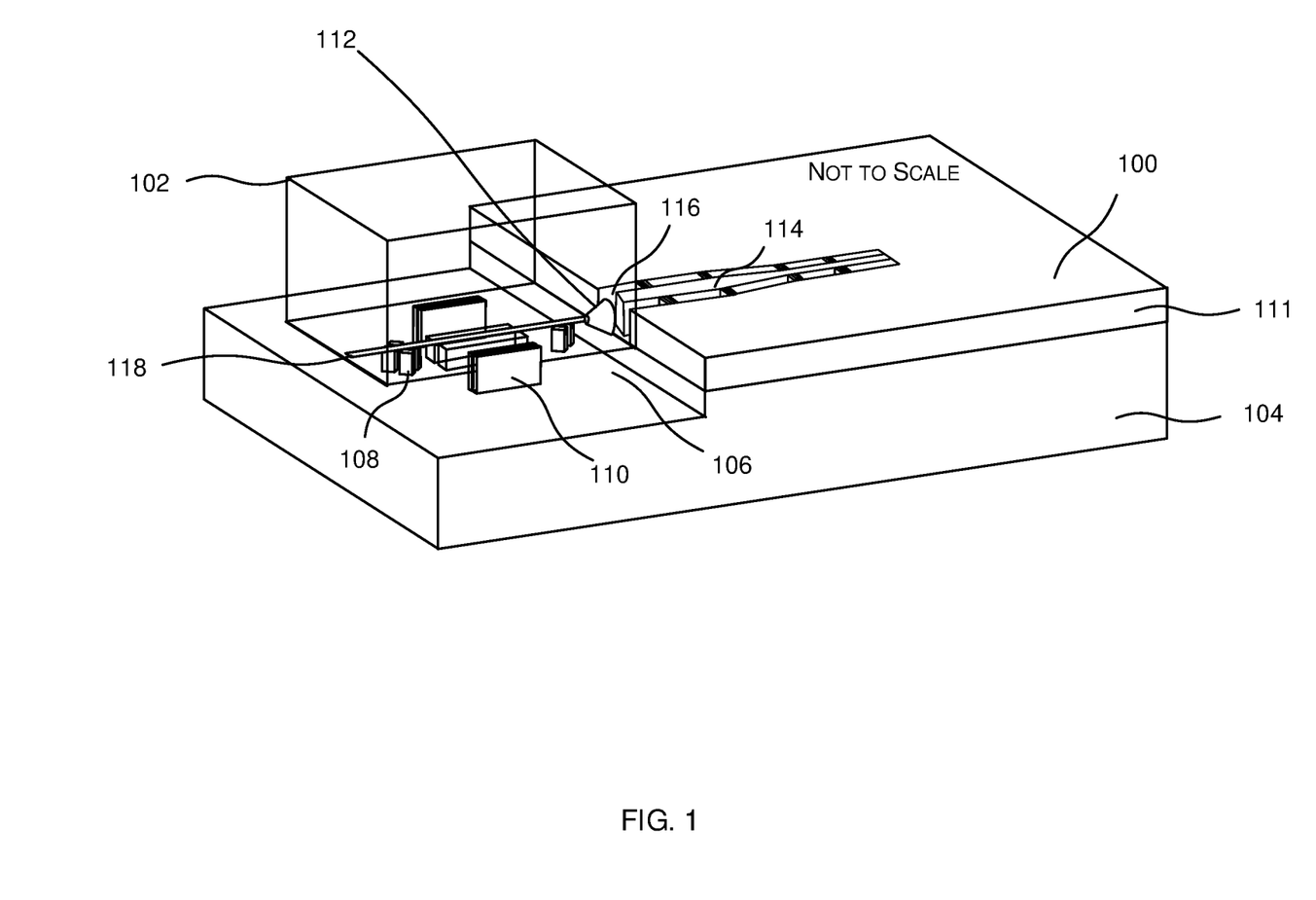
FIG. 1 shows a schematic diagram of Photonic Integrated Circuit, according to an embodiment of the present invention.

FIG. 1 shows a Photonic Integrated Circuit (PIC) 100 having a laser diode 102 integrated therewith on a silicon substrate 104 having a trench 106 for accommodating the laser diode. The technique could work equally well with other device combinations, for example a silicon optical amplifier. Returning to FIG. 1, a silicon or oxide layer 108 overlies the substrate. The silicon substrate 104 is thicker in the region of the PIC 100 than in the region of the laser diode 102 (i.e. in the trench 106). In general, the substrate in the region of PIC could be thicker (with oxide on top), thinner or even the same size as in the region of laser diode. This depends on the actual design related to the laser diode dimensions. However, the silicon surface in the region of laser diode is preferred because silicon provides a better heat dissipation compared with oxide.

In order for the photonic chip to work, it is essential that a laser beam generated by the laser diode should arrive at the "correct position" for coupling with the PIC. A waveguide of the laser diode must align with a coupler in the PIC. In other words, there is an optimal predetermined position for the positioning of the laser diode relative to the PIC. This may be referred to as the "correct position" or "correct alignment" of the laser diode and the PIC. The predetermined position has a small tolerance over which the PIC and laser diode are correctly aligned. It is this tolerance that is an object of the present invention.

The silicon substrate includes an asymmetric alignment arrangement 107 which includes by way of example a plurality of alignment keys 108 and at least one stopper 110. The term asymetric as used herein is in respect of an axis or plane along, for example, the direction of propagation of the laser beam of the laser diode, although different points of reference can be used and elements may just be asymmetrical to one another. The stopper and alignment keys may have different heights so as to achieve a high bonding alignment accuracy in all directions. Some or all of the alignment keys may be asymmetric alignment keys to further improve the alignment accuracy and hence the coupling efficiency. The asymmetric alignment arrangement, stopper and alignment keys will be described in greater detail below. It should be noted that the asymmetric alignment arrangement may include more or less components or elements for different applications.

The PIC 100 includes an oxide layer 111 which is formed over the silicon substrate 104. The PIC 100 further includes a gap 112 in which is located one or more suspended couplers 114. It is preferred that the gaps is as small as possible and preferably there should be no gap. The suspended coupler is a silicon coupler design with wide alignment tolerance inside the photonic chips. The suspended coupler gives rise to less reflection of the incident light entering the PIC. At the edge of the coupler, juxtaposed to the laser diode, the coupler includes a tilted facet 116. The facet is tilted in two directions, for example a vertical and lateral direction. The purpose of the tilted facet is to avoid reflection of incident light from the laser diode, in use.

The laser diode 102 is attached to the substrate and positioned relative to the PIC such that light from the laser diode is correctly aligned to enter the PIC via the tilted facet 116. The tilted facet is angled in vertical and lateral directions to reduce the back reflection of light coming from the laser diode. A laser waveguide 118 passes through the laser diode in between at least some of the asymmetric alignment keys or stoppers, in a manner which will be described in great detail below.

The laser diode attachment is implemented with lateral (butt coupling) approach in which a flip chip bonding technique is employed. A complementary metal-oxide-semiconductor (CMOS)-compatible process is employed for the silicon photonic chips fabrication. A back end of line (BEOL) process is used to form the metallization and the solder on the Silicon on Insulator (SOI) platform. The final oxide layer 111 comprises two parts: a buried oxide (BOX) layer forming an insulator part of the SOI wafer; and a cladding oxide which may be deposited during the fabrication processes. The silicon waveguides are inside layer 111 surrounded by the oxide.

The laser diode includes a laser diode waveguide can be used for the bonding alignment of the laser diode to the PIC. It is more preferable that the accurate alignment marks are included in the laser diodes to achieve this alignment. Without accurate alignment the coupled beam will either fail to enter the PIC or have an attenuated illumination.

Figure 2:
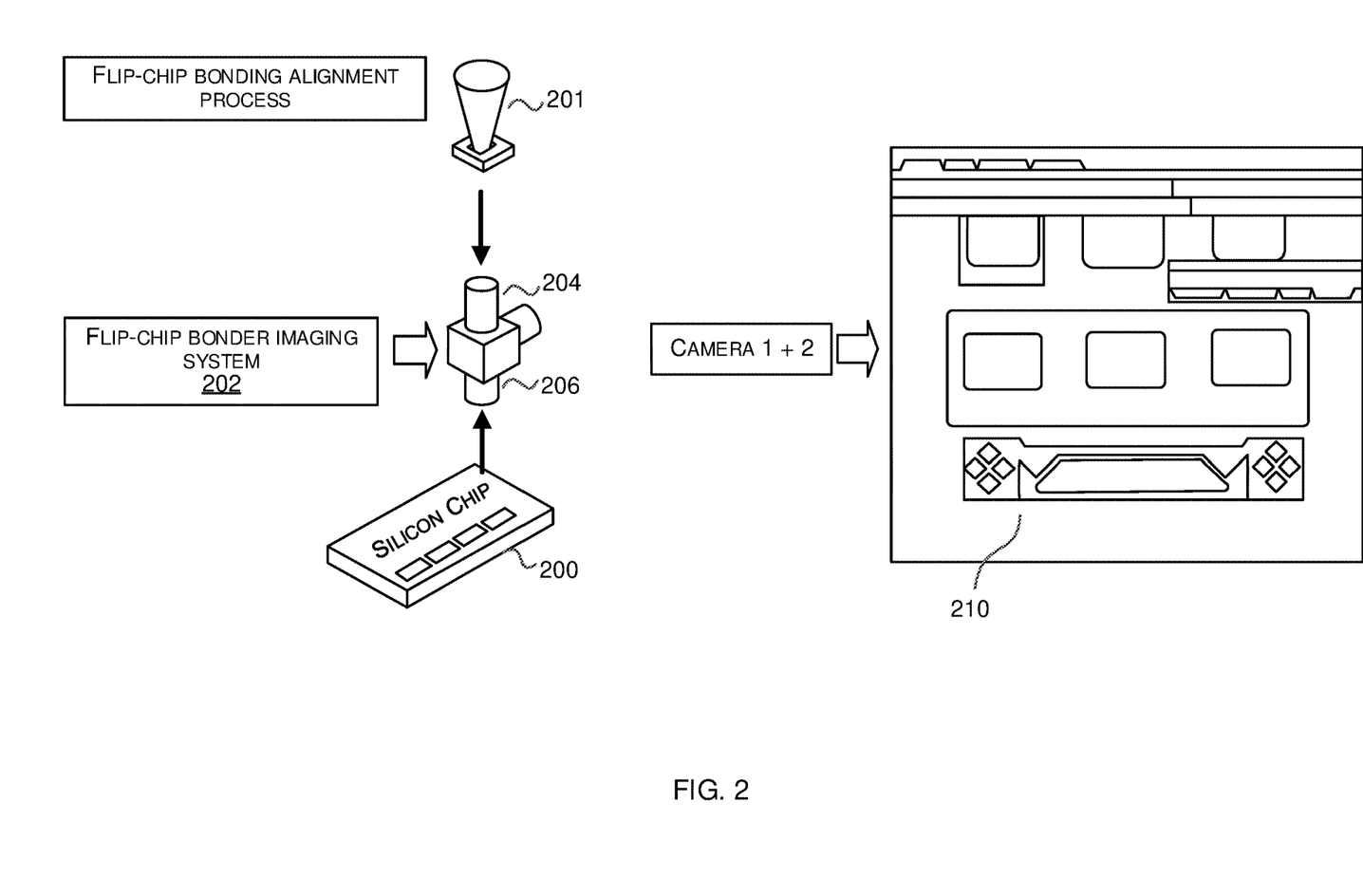
FIG. 2 is an example of a flip chip bonding process.

It is helpful to understand the flip-chip bonding process prior to further details of the alignment process. Referring to FIG. 2, during the bonding process, the silicon chip 200 will be placed on a chuck of a bonder. The laser diode chip will be picked up by chipping tool 201 and positioned for the alignment process. The alignment between the laser diode chip and the substrate silicon PIC chip will be performed with the visual aid of the bonder imaging system 202 as shown in the FIG. 2. Two cameras 204 and 206 simultaneously capture images of the laser diode bottom surface and PIC chip top surface. Through the imaging processing, a superimposed video 208 will be shown on the display of the control system. A system software with an appropriate program will perform an auto alignment or alignment with a manual assist. By designing the proper alignment keys (shown generally as 210 in the video image), the mechanical alignment process will be converted to the image processing with an alignment accuracy readout and a feedback process. By having an appropriate design as taught by the present invention, the alignment accuracy will be enhanced.

Figure 3A:
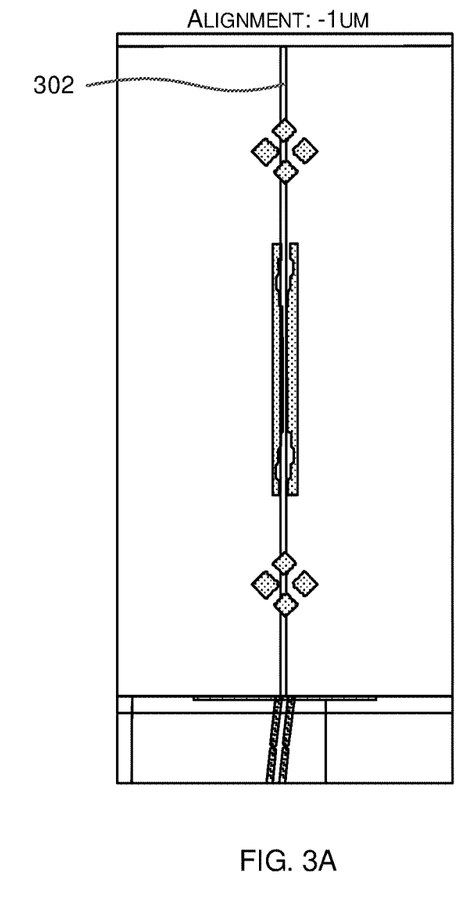
FIGS. 3A to 3C are schematic diagrams of the asymmetric alignment key designs, according to an embodiment of the present invention.
Figure 3B:
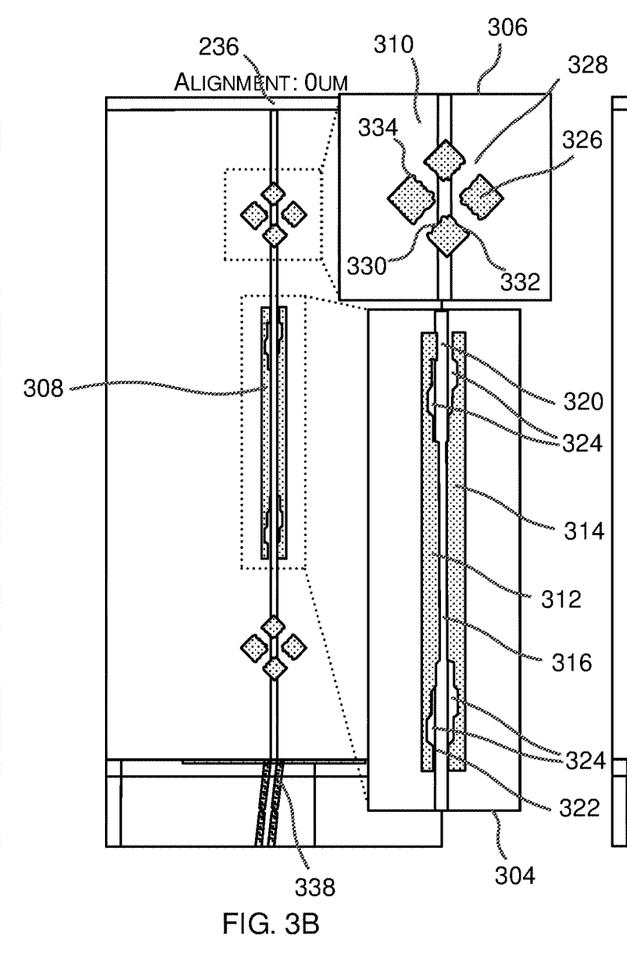
Figure 3C:
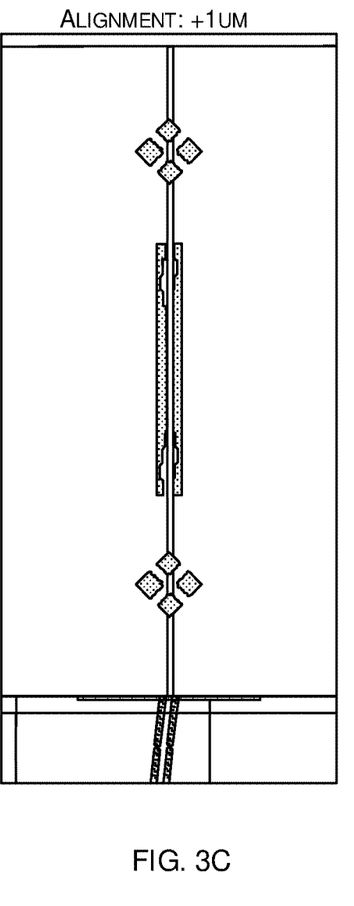
Figure 4:
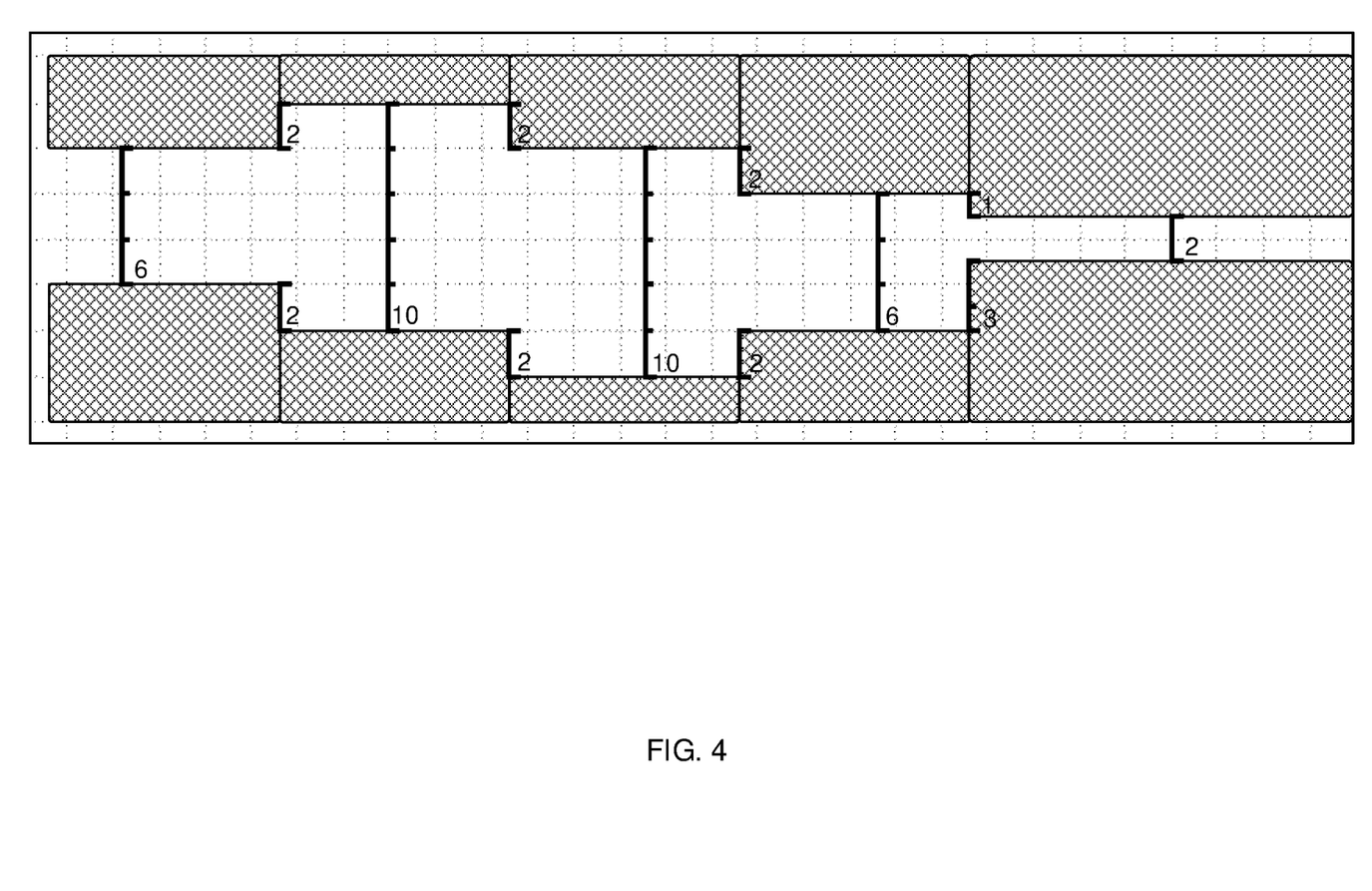
FIG. 4 is a cross-sectional view showing example dimensions and detail for an asymmetric alignment key element.

Referring to FIG. 3, the silicon substrate is provided with a plurality of alignment keys shown generally as 300 which form part of the asymmetric alignment arrangement 107. The dotted line 302 is used to simulate the laser diode waveguide during bonding. FIG. 3B includes two blown up portions 304 and 306 illustrating respectively a first asymmetric alignment key 208 and a second alignment key 310 according to the present invention. In FIG. 3A the alignment is accurate and there is no angular displacement of the laser diode waveguide 302. The blown up section 304 includes two elongate elements 312 and 314 which have a gap 316 there between. The gap has a predefined profile which changes along the length and in use provides a channel through which the laser diode beam passes. The shape of the two elements 312 and 314 defines a channel which has a variable width. In a central area 318 the channel is of uniform spacing of about 2 um. At either end 320 and 322 the channel is wider than the central channel and include a plurality of notches 324 which define an asymmetrical channel. The elements 312 and 314 are thus asymmetrical with one another. In the example shown the elements are asymmetric along the axis of the laser waveguide. Elements 312 and 314 are essentially the same shape with a first profile at one end and second profile at the other end. The elements 312 and 314 lie next to each other with opposing respective first and second end juxtaposed with one another. FIG. 4 shows examples of the dimensions of the first and second profiles. The units of all measurements are micrometers (um) The segments of the profiles are purposely shifted by a certain amount with respect to the others so that it can form a measurement structure to identify the misalignment between the alignment keys and the actual laser diode waveguides. The laser diode waveguides and the alignment keys positions will be shown on the flip-chip bonder monitor screen. FIG. 3A-C and FIG. 6A-C illustrates the superimposed images that show both the laser diode and PIC chip surfaces as shown in FIG. 1.

Figure 5:
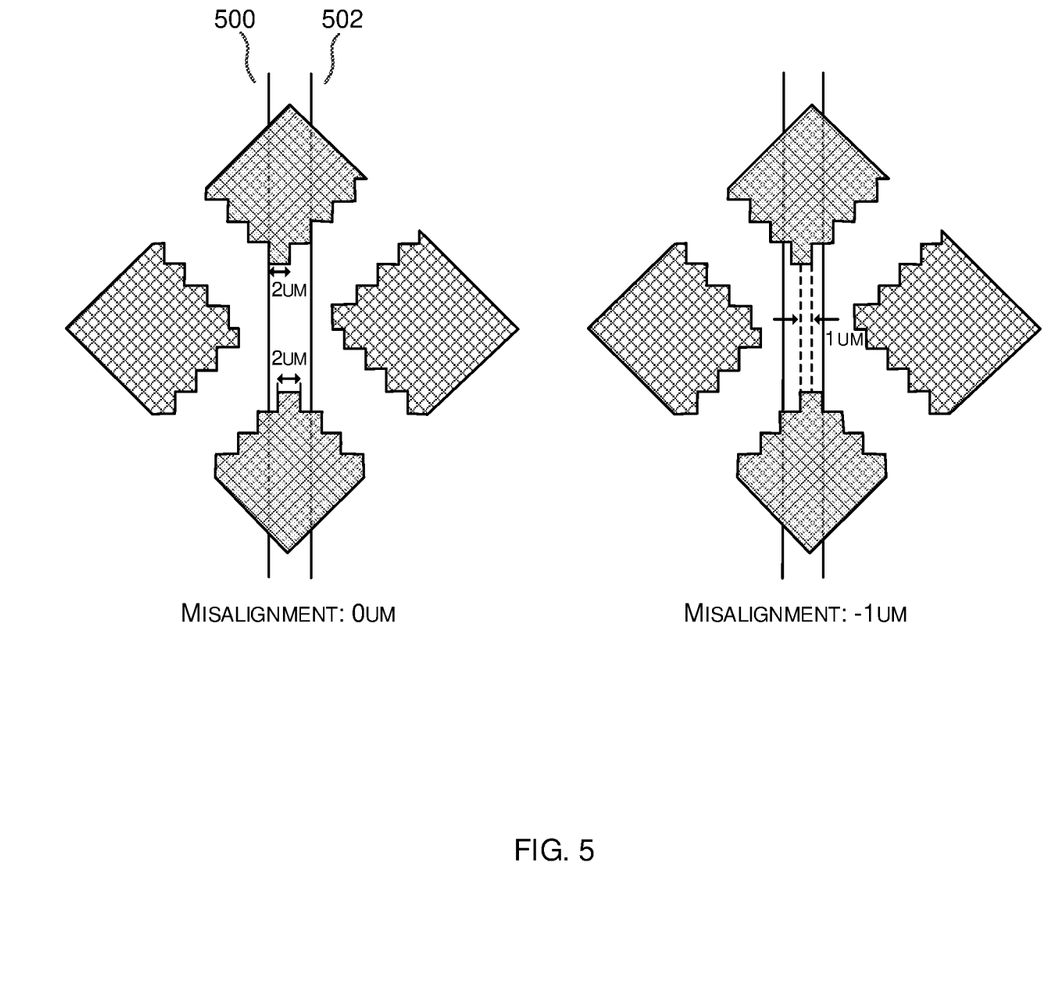
FIG. 5 is a view showing examples on misalignment with respect to an asymmetric alignment key element.

At either end of the elongate elements, there is a second alignment key 310 which is shown in more detail in the blown up section 306. The second alignment key 310 includes four columns 326 having a near square cross-section. The four elements are arranged in a further square shape 328 in which the inner edges of each column 326 includes two inward facing faces 330, 332 having a plurality of notches 334 which define an irregular profile. FIG. 5 shows the form of the elements in more detail. As explained above, FIG. 3A-C and FIG. 6A-C illustrates the superimposed images that show both the laser diode and PIC chip surfaces. The alignment key 310 is the structure formed on the silicon PIC chip shown as hatched sections in FIGS. 4 and 5. It should be noted, that all dimensions shown in the drawings are by way of example only and other dimensions could be used.

The lines 500, 502 in FIG. 5 illustrate the overlapping images of the laser diode waveguide during the alignment process. With the visual aid system, the alignment keys can be used as readout structures to measure the misalignment value and thus provide a real-time compensation of misalignment.

The asymmetric alignment arrangement includes one or more Vernier scale structure to enhance visual aid for the alignment accuracy. For example as described herein the Vernier structures are formed by the notches on elements 312 and 314 and on columns 328 of the alignment keys. The Vernier scale structure enables measurement and adjustment of the laser diode relative to the PIC. The central position of the beam aligns with specific notches of the asymmetric alignment keys, from this a relative movement of the laser diode relative to the PIC can be made to correct the alignment. As a visual aid, a Vernier Scale design can increase the alignment resolution and reduce measurement uncertainty by using mechanical interpolation on the structures. With the high-resolution camera system (mentioned above), the misalignment can be controlled within a submicron range. A displacement of 1 um can be easily identified, using the present invention.

Compared with a normal symmetric design, the asymmetric design with a Vernier scale is more obvious and it is easier to adjust the misalignment during the bonding process with visual assistant system. The amount of misalignment can be accurately distinguished or read out using the asymmetric design of the alignment keys. Once the amount of misalignment is determined, it can be used as the real-time compensation of the machine misalignment during the programmable bonding process.

As shown in FIGS. 3A and 3C there are alignment errors of respectively −1 um and +1 um at the entry point 336 of the beam. However, the coupling at the far end of the laser diode waveguide 338 is within sufficient tolerance to directly enter the PIC without any significant attenuation of the beam. The asymmetric alignment arrangement improves the accuracy of alignment of the laser diode waveguide into the PIC in all directions. The alignment keys aiding the lateral placement and the stoppers (not shown in FIG. 2) aiding the relative heights of the components. The alignment keys enable minimizing the scale and quantify the misalignment (to be within a submicron range). By have such asymmetric design, the lateral alignment accuracy can be significantly enhanced and quantified. The misalignment can be read out. The asymmetrical keys, may have keys having a purposely-patterned displacement to form the required interpolation. The keys may be a predetermined shape and size which enables the misalignment to be identified and corrected. The Vernier scale discussed above is one example of the purposely-patterned displacement, but other may equally well be used.

Figure 6A:
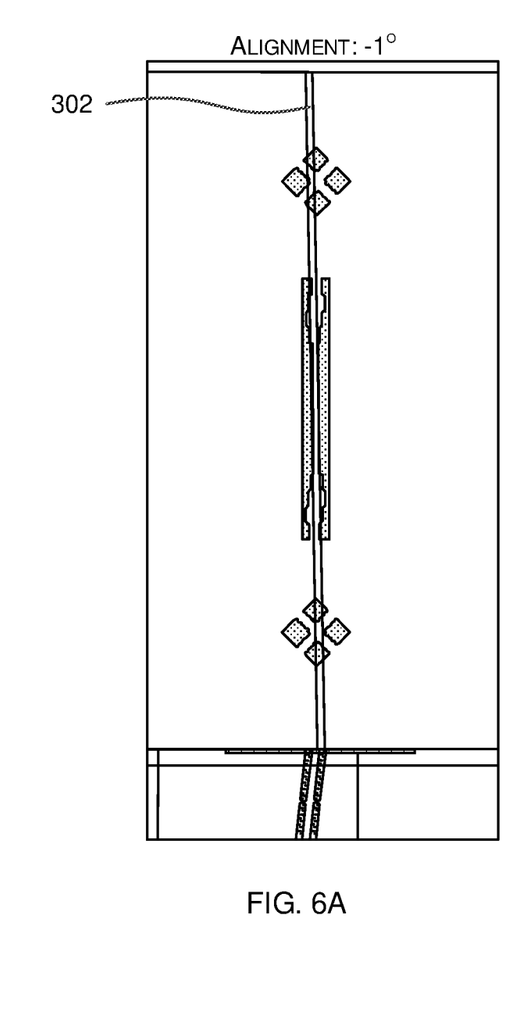
FIG. 6A to 6C, are a simplified version of the respective FIG. 3 designs, showing less detail.
Figure 6B:
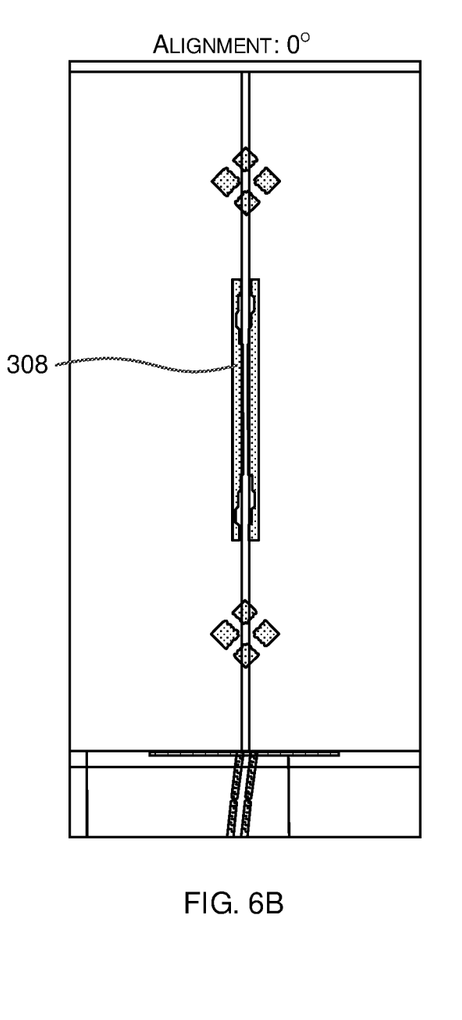
Figure 6C:
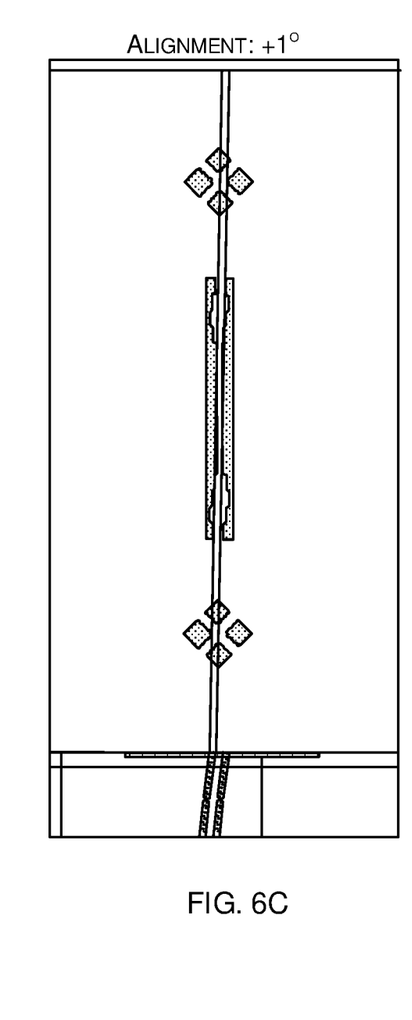

FIG. 6A to 6C are similar to FIG. 3A to 3C except that the misalignment is angular rather than a spacing. The same overall result is achieve the asymmetric keys enable alignment accuracy even if the input beam is offset by a specific angle. In both FIGS. 3 and 6 the misalignments have values of ±1 um or ±1°. It will be appreciated that the asymmetric alignment keys may give rise to a noticeable misalignment readout when the values are between, by way of example, ±1 um or ±1°.

Figure 7:
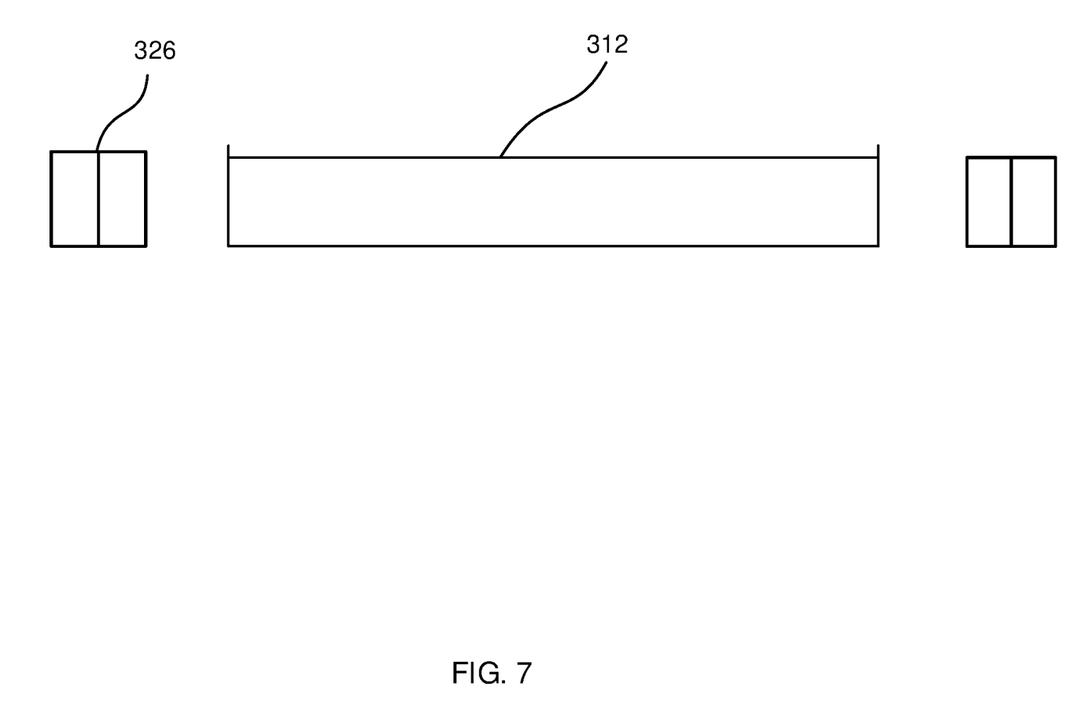
FIG. 7 is a side on view of the asymmetric alignment keys of FIGS. 3 and 6.

FIG. 7 shows a cross-section of the FIGS. 3 and 6 arrangements showing one of the columns of the second alignment key 226 at each end of one of the asymmetric alignment keys 212. The height of each element is shown as uniform, but may be different for some applications. For example, a variable height alignment key may perform the function of the stoppers as described below, where the variable height causes the correct alignment of the laser diode relative to the PIC.

Figure 8:
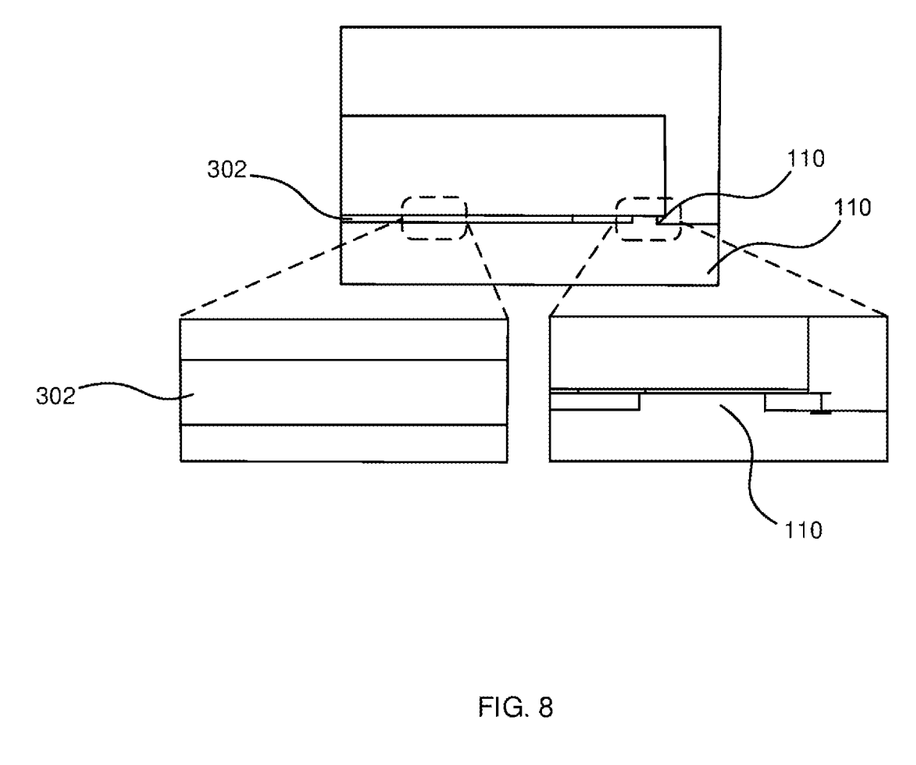
FIG. 8 is a diagram showing examples of stoppers, according to an embodiment of the present invention.

As mentioned in FIG. 1, there may be one or more stoppers 110 forming part of the asymmetric alignment arrangement 107. FIG. 8 shows more detail of the stoppers 110. The stoppers are arranged to achieve sub micron vertical alignment accuracy of the laser diode and PIC and are situated on either side of the asymmetric alignment keys 308 (not shown in FIG. 8). An etch stop layer is used for the actual layout design and process flow. This can provide a good level of uniformity in the process and the exact height of the stopper can be precisely controlled. The stoppers and alignment keys can have similar or different heights depending on the application. The stopper defines a predetermined vertical height that forms part of the predetermined position of the laser diode relative to the PIC.

In combination, the alignment keys and the stoppers (the asymmetric alignment arrangement) enable accurate positioning of the laser diode relative to the PIC. If the alignment keys have different heights they may perform the function of the stoppers and the stoppers may be dispensed with. In this case the alignment keys alone form the asymmetric alignment arrangement. In use, the asymmetric alignment arrangement is designed to provide optimal alignment of the PIC and the laser diode. The Vernier scale allows for very small adjustments to be made to ensure that the laser diode is correctly positioned. In addition, the present invention provides a further feature which assists in the alignment and subsequent operation of the PIC. This is a suspended coupler which helps to ease the alignment tolerance with a large optical mismatch between the laser diode output and the PIC.

Figure 9:
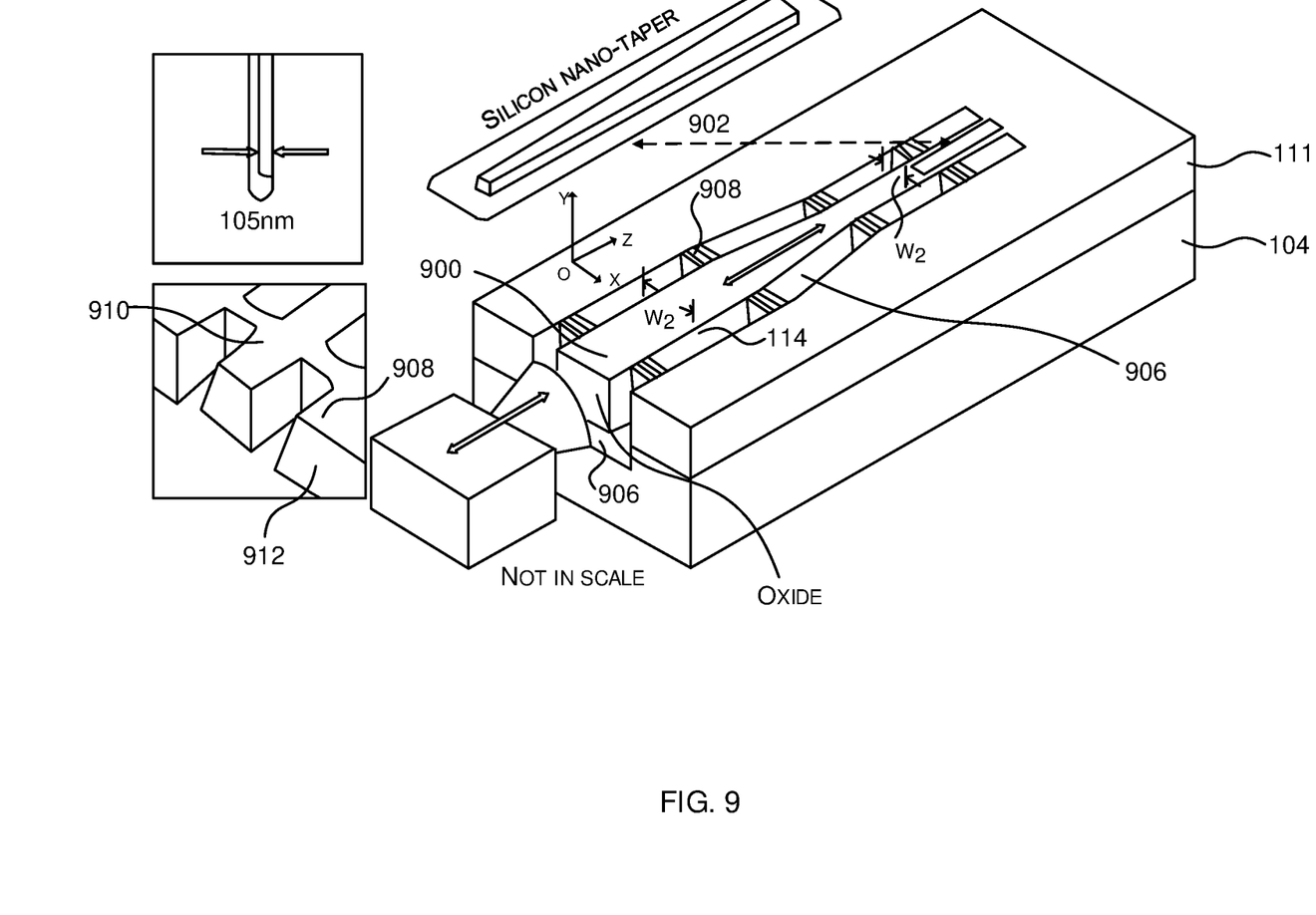
FIG. 9 is a diagram showing a coupler, according to an embodiment of the present invention.

A suspended coupler is shown in FIG. 9 at 114. The suspended coupler is designed with relative large alignment tolerance. A key challenge to achieving efficient coupling between a laser diode and a silicon waveguide is the modal mismatch. The commonly available distributed feedback laser diodes (DFB LDs) exhibit large beam divergence (normally the full width half maximum (FWHM) beam divergence for both vertical and horizontal direction is larger than 20°) this results from the small output light mode size of ~2 μm. In order to achieve high coupling efficiency between the laser diode and silicon waveguide, the modal mismatch and tight alignment tolerance issues must be addressed simultaneously. Therefore, an efficient coupler needs to be provided to couple the divergent beam output light from the laser diode to the silicon nano-wire waveguides. Use of a suspended structures enables improvements in the alignment tolerance.

FIG. 9 shows a schematic of the suspended coupler 114 designed for coupling to laser diode on the SOI platform. The coupler comprises a suspended oxide waveguide 900 and a silicon nano-taper 902. A relatively large dimension is designed at the input facet 906 for the suspended oxide waveguide in order to enhance the alignment tolerance when coupling to laser diode (not shown). In order to mitigate the optical loss, the coupler is isolated by air-isolation trenches 908 formed by removing the adjacent oxide layer and underlying substrate silicon. Several pairs of oxide arms 910 are therefore designed to provide the mechanical support for the suspended structures. A silicon nano-taper 902 is designed to couple the light inside oxide waveguide to silicon photonic circuit. The suspended coupler is located on the silicon substrate and formed as part of the oxide layer 111. The end portion closest to the wave guide is shown in more details in inset 912.

The laser diode and PIC chip are constructed as follows. In a first step the silicon substrate is etched to obtain the required profile for the PIC device and laser diode combination being made. This may include etching the alignment keys, stoppers and suspended coupler with tilted facet. An oxide layer is added to define the PIC and the suspended coupler, in a trench. A back end of line (BEOL) process is used to from metallization's and solder on the platform. In order to prepare the platform for laser diode bonding, the SOI wafer may need two layers of metallization to define gold (Au) contact pads for electrical connection and gold/Tin (AuSn) or other material (such as SnAg) pads. The laser diode is attached by a flip chip bonding technique. The laser diode is butt coupled to the tilted facet area of the coupler. The relative positions are adjusted using the stoppers and alignment keys.

The brief fabrication process can be described as follows. The silicon photonic circuit is fabricated on a commercial 8-inch 220-nm-thick SOI wafer with for example, a 3-μm-thick buried oxide layer. The SOI wafer is patterned with designed masks in for example, a 248-nm deep ultraviolet optical lithography system. On the silicon photonic circuit, a laser diode trench is etched to form the interface between the light source and the silicon waveguide. The alignment keys and stoppers are formed by for example, a dry etching process inside the laser trench. Besides the CMOS-compatible process on SOI platform, the BEOL processes are employed to form an underbump metallurgy (UBM) process and a solder process prepare for subsequent laser diode flip-chip bonding.

Figure 10:
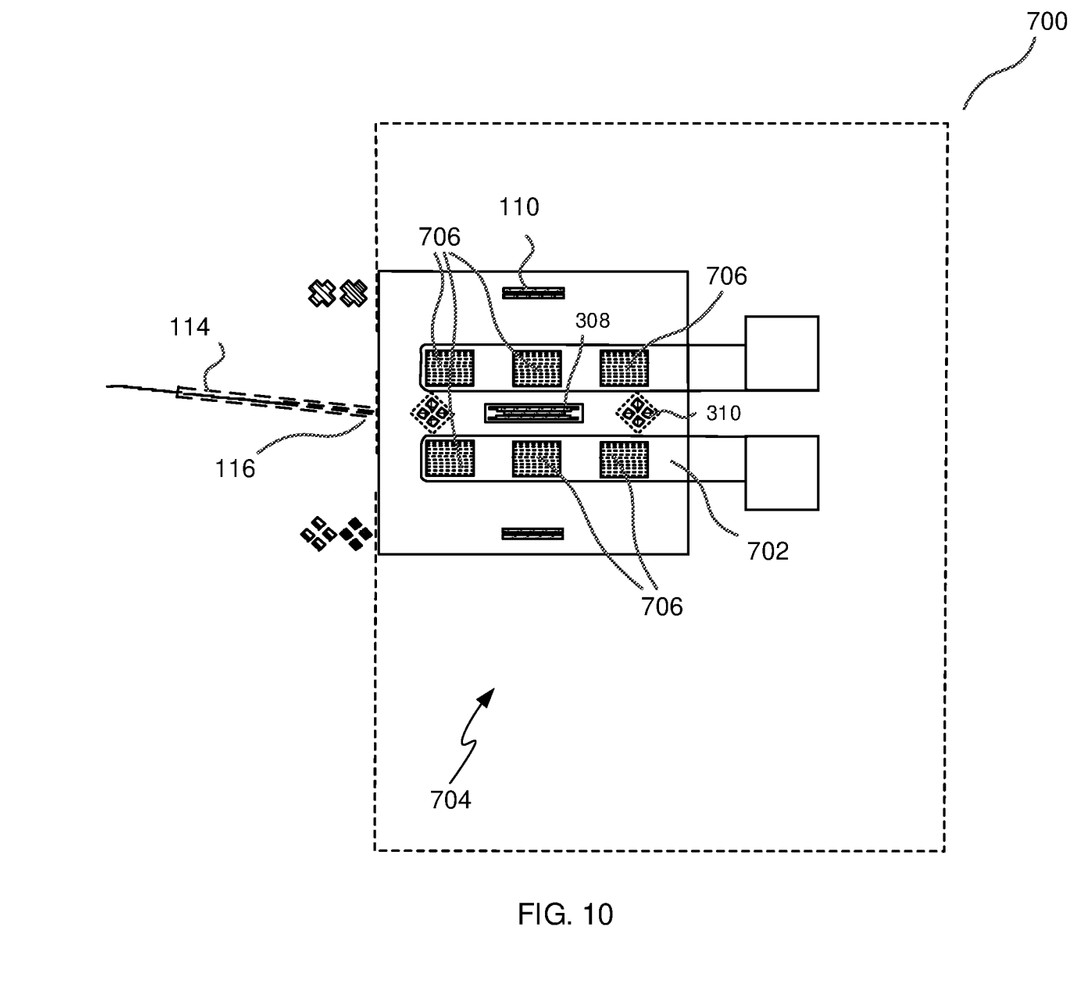
FIG. 10 shows an example process design kit (PDK) black box design of a PIC according to an embodiment of the present invention.

A further embodiment of the present invention a process design kit (PDK) of the asymmetric alignment arrangement shown as 700 in FIG. 10. The PDK includes a set of files used to model the operation of the fabrication of the required elements of the structure being fabricated. In this case the files give rise to the set of steps necessary to construct the PIC, including the structures necessary to form the asymmetric alignment arrangement and associated elements. The PDK is used to develop a flow or set of steps or actions necessary to make the required structure. The steps are stored as software code which can be implemented in a chip fabrication system. The code generates instruction which when implemented in the chip fabrication system apply the necessary layers of the device to be manufacture. The design set can include some or all of the steps for the chip and the asymmetric alignment arrangement. FIG. 10 is an example design mask layout for the present invention. The design step can be stored on computer readable media and processed on an appropriate computer device to enable the steps to be carried out.

The PDK kit allows for formation of the alignment keys 308 and 310; the stopper 110 (together the asymmetric alignment arrangement 700). The construction of the suspended coupler 114 and associated tilt design 116 are also produced. Further elements may comprise a laser trench shown generally at 704 and a box 706. The "laser" trench is the trench in the PIC chips to host the flip-chip bonded laser diode chips. Because the laser output beam is a certain distance from the laser diode chip surface, the trench depth and the surface of the alignment keys and stoppers have to be designed according to the laser diode dimensions. The other structures outside the dotted line are the additional unused alignment marks.

The present invention provides a number of advantages as will be clear from above and the following. The invention provides a method and design in which a low loss lateral light source integration on silicon photonic chips using flip-chip bonding, butt coupling and wire bonding techniques with alignment accuracy enhancement. This gives rise to a device design and wafer scale fabrication process is which is a straight forward packaging solution. The alignment keys provide a wide alignment correction capability and improve the alignment of devices compared with previous designs and methods.

As the process is CMOS-compatible it can be used for the LD trench 704 on silicon chips. On the silicon photonic circuit, a laser diode trench is etched to form the interface between the light source and the silicon waveguide. The process is decoupled process with a one step flip-chip bonding of the laser diode. As the alignment is essentially passive it is suitable for high throughput packaging, thus low cost. Active alignment is used to describe the process of dynamic assembly. It includes the process of placing an optical component, usually a lens, a sensor or laser while continuously maximizing the coupled power. For a laser diode active alignment, an electrical burn-in process may be required to turn on the laser diode while carrying out the chips alignment. In a passive alignment technique, the chips are aligned by using passive alignment structures or by the use of patterned alignment marks.

Any range or device value given herein may be extended or altered without losing the effect sought, as will be apparent to the skilled person.

According to an aspect of the present invention there is provided a photonic integrated chip, PIC, configured for alignment and attachment of a laser diode in a predetermined position in which light from the laser diode is aligned with an input of the PIC; wherein the photonic chip comprises an asymmetric alignment assembly for receiving and aligning the laser diode in the predetermined position; and wherein the input comprises a coupler for receiving a laser beam from the laser diode in use.

Preferably, the asymmetric alignment arrangement comprises a plurality of alignment keys configured to align the attachment of the laser diode in the predetermined position.

Preferably, at least one pair of alignment keys are asymmetric relative to one another.

Preferably, the pair of alignment keys are elongate and run along a direction substantially parallel to the laser beam in use.

Preferably, the pair of alignment keys include a gap between them defining a channel through which the laser waveguide can be aligned.

Preferably, the gap includes a central region having a uniform profile and two sections at either end, each having a respective first irregular profile and second irregular profile; and wherein the first irregular profile of one of the pair is juxtaposed to the second irregular profile of the other of the pair.

Preferably, the alignment assembly includes a second alignment element.

Preferably, the second alignment element include a plurality of substantially square cross section columns arranged in a predetermined shape through which a laser beam may pass in use.

Preferably, there are four columns arranged at the four corners of a substantially square predetermined shape, wherein the columns are separated by gaps there between and wherein the inward facing walls include an third irregular profile.

Preferably, the or each irregular profile includes a Vernier scale to enable positioning of the laser diode in the predetermined position.

Preferably, the asymmetrical alignment assembly includes one or more stoppers which have a predetermined vertical height for positioning the laser diode relative to the PIC.

Preferably, the coupler is a suspended coupler.

Preferably, the suspended coupler includes a suspended oxide waveguide and a silicon nano-taper.

Preferably, the suspended coupler comprising a large input facet for the suspended coupler in order to enhance the alignment tolerance when coupling to the laser diode.

Preferably, the suspended coupler is isolated from the chip by one or more air-isolation trenches formed by removing the adjacent oxide layer and underlying substrate silicon.

Preferably, one or more oxide arms 910 are formed to provide a mechanical support for the suspended coupler.

Preferably, the silicon nano-taper is designed to couple the light inside oxide waveguide to silicon photonic circuit.

Preferably, the coupler includes a tilted face for receiving a laser beam in use.

Preferably, the tilted face is angled in a vertical direction and a lateral direction.

Preferably, including a laser diode in the predetermined position.

According to a further aspect of the present invention there is provided a method of fabricating a photonic integrated chip, PIC, adapted to receive a laser diode in a predetermined positon, the method comprising: forming a from a first material a substrate, the substrate comprising an asymmetric alignment arrangement defining the predetermined position; forming from at least one second material a chip for a function and having an a coupler for receiving a laser beam in use.

Preferably, further comprising: forming a plurality of alignment keys configured to align the attachment of the laser diode in the predetermined position.

Preferably, further comprising: forming at least one pair of alignment keys to be asymmetric relative to one another.

Preferably, further comprising: forming the pair of alignment keys as elongate elements that run along a direction substantially parallel to the laser beam in use.

Preferably, further comprising: forming the pair of alignment keys to include a gap between them defining a channel.

Preferably, further comprising: forming the gap to include a central region having a uniform profile and two sections at either end, each having a respective first irregular profile and second irregular profile; and forming the first irregular profile of one of the pair to be juxtaposed to the second irregular profile of the other of the pair.

Preferably, further comprising forming a second alignment element.

Preferably, further comprising forming the second alignment element to include a plurality of substantially square cross section columns arranged in a predetermined shape through which a laser beam may pass in use.

Preferably, further comprising forming four columns arranged at the four corners of a substantially square predetermined shape, wherein the columns are separated by gaps there between and wherein the inward facing walls include an third irregular profile.

Preferably, further comprising: forming the irregular profile to include a Vernier scale which is used to position the laser diode in the predetermined position Preferably, further comprising: forming one or more stoppers as part of the asymmetrical alignment assembly which stoppers are formed at a predetermined vertical height for positioning the laser diode relative to the PIC.

Preferably, further comprising: forming the coupler as a suspended coupler comprising the steps of: forming a suspended oxide waveguide; and forming a silicon nano-taper.

Preferably, further comprising: isolating the coupler by air-isolation trenches formed by removing a adjacent oxide layer and an underlying substrate silicon.

Preferably, further comprising: forming one or more pairs of oxide arms to provide the mechanical support for the suspended waveguide.

Preferably, further comprising: forming the coupler to include a tilted face for receiving a laser beam in use.

Preferably, further comprising: forming the tilted face angled in a vertical direction and a lateral direction.

Preferably, further comprising positioning a laser diode on the alignment arrangement to position the laser diode in the predetermined position.

Preferably, further comprising a flip chip process.

According to a further aspect of the present invention there is provided a process design kit for forming a photonic integrated chip which when processed in a chip fabrication system causes the chip fabrication system to from the photonics integrated chip of another aspect of the invention.

According to a further aspect of the present invention there is provided a computer readable storage medium having stored thereon a computer readable description of a chip that, when processed in chip fabrication system, causes chip fabrication system to manufacture a photonic integrated chip of another aspect of the invention.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in a process design kit configures the system to manufacture some or all of the devices herein.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

There may be provided a method of manufacturing, at process design kit as described herein. Furthermore, there may be provided process design kit dataset that, when processed in an chip fabrication system, causes the method of manufacturing a PIC and/or asymmetric alignment arrangement as described herein.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A photonic integrated chip, PIC, configured for alignment and attachment of a laser diode in a predetermined position in which light from the laser diode is aligned with an input of the PIC;
wherein the photonic chip comprises an asymmetric alignment arrangement for receiving and aligning the laser diode in the predetermined position,
wherein the input comprises a coupler for receiving a laser beam from the laser diode in use,
wherein the asymmetric alignment arrangement comprises a plurality of alignment keys configured to align the attachment of the laser diode in the predetermined position,
wherein at least one pair of alignment keys are asymmetric relative to one another,
wherein the pair of alignment keys are elongate and run along a direction substantially parallel to the laser beam in use, wherein the pair of alignment keys include a gap between them defining a channel through which the laser waveguide can be aligned,
wherein the clap includes a central region having a uniform profile and two sections at either end, each having a respective first irregular profile and second irregular profile, and
wherein the first irregular profile of one of the pair is juxtaposed to the second irregular profile of the other of the pair.

2. The photonic integrated chip according to claim 1, wherein the asymmetric alignment arrangement includes a first alignment key and a second alignment key,
wherein the second alignment key include a plurality of substantially square cross section columns arranged in a predetermined shape through which a laser beam may pass in use,
wherein there are four columns arranged at the four corners of a substantially square predetermined shape, wherein the columns are separated by gaps there between and wherein the inward facing walls include a third irregular profile.

3. The photonic integrated chip according to claim 1, wherein the or each irregular profile includes a Vernier scale to enable positioning of the laser diode in the predetermined position.

4. The photonic integrated chip according to claim 1, wherein the asymmetrical alignment arrangement includes one or more stoppers which have a predetermined vertical height for positioning the laser diode relative to the PIC.

5. The photonic integrated chip according to claim 1, wherein the coupler is a suspended coupler,
wherein the suspended coupler includes a suspended oxide waveguide and a silicon nano-taper,
further comprising a large input facet for the suspended coupler in order to enhance the alignment tolerance when coupling to the laser diode,
wherein the suspended coupler is isolated from the chip by one or more air-isolation trenches formed by removing the adjacent oxide layer and underlying substrate silicon,
wherein one or more oxide arms are formed to provide a mechanical support for the suspended coupler.

6. The photonic integrated chip according to claim 5, wherein the silicon nano-taper is designed to couple the light inside oxide waveguide to silicon photonic circuit.

7. The photonic integrated chip according to claim 5, wherein the coupler includes a tilted face for receiving a laser beam in use, wherein the tilted face is angled in a vertical direction and a lateral direction.

8. The photonic integrated chip according to claim 1, including a laser diode in the predetermined position.

9. A method of fabricating a photonic integrated chip, PIC,
adapted to receive a laser diode in a predetermined position, the method comprising:
forming from a first material a substrate, the substrate comprising an asymmetric alignment arrangement defining the predetermined position;
forming from at least one second material a chip for a function and having a coupler for receiving a laser beam in use;
forming a plurality of alignment keys configured to align the attachment of the laser diode in the predetermined position;
forming at least one pair of alignment keys to be asymmetric relative to one another,
forming the pair of alignment keys as elongate elements that run along a direction substantially parallel to the laser beam in use;
forming the pair of alignment keys to include a gap between them defining a channel;
forming the gap to include a central region having a uniform profile and two sections at either end, each having a respective first irregular profile and second irregular profile; and
forming the first irregular profile of one of the pair to be juxtaposed to the second irregular profile of the other of the pair.

10. The method according to claim 9,
further comprising:
forming a first alignment key and a second alignment key,
forming the second alignment key to include a plurality of substantially square cross section columns arranged in a predetermined shape through which a laser beam may pass in use,
forming four columns arranged at the four corners of a substantially square predetermined shape, wherein the columns are separated by gaps there between and wherein the inward facing walls include a third irregular profile.

11. The method of claim 9, further comprising: forming the irregular profile to include a Vernier scale which is used to position the laser diode in the predetermined position.

12. The method of claim 9, further comprising:
forming one or more stoppers as part of the asymmetrical alignment arrangement which stoppers are formed at a predetermined vertical height for positioning the laser diode relative to the PIC.

13. The method of claim 9, further comprising:
forming the coupler as a suspended coupler comprising the steps of:
- forming a suspended oxide waveguide; and forming a silicon nano-taper;
- isolating the coupler by air-isolation trenches formed by removing an adjacent oxide layer and an underlying substrate silicon;
- forming one or more pairs of oxide arms to provide the mechanical support for the suspended waveguide;
- forming the coupler to include a tilted face for receiving a laser beam in use; and
- forming the tilted face angled in a vertical direction and a lateral direction.

14. The method according to claim 9, further comprising:
positioning a laser diode on the alignment arrangement to position the laser diode in the predetermined position; and
a flip chip process.

15. A process design kit for forming a photonic integrated chip which when processed in a chip fabrication system causes the chip fabrication system to form the photonics integrated chip of claim 1.

16. A computer readable storage medium having stored thereon a computer readable description of a chip that, when processed in chip fabrication system, causes chip fabrication system to manufacture a photonic integrated chip as claimed in claim 1.

* * * * *

UNITED STATES PATENT AND TRADEMARK OFFICE
CERTIFICATE OF CORRECTION

PATENT NO. : 11,960,118 B2
APPLICATION NO. : 17/602550
DATED : April 16, 2024
INVENTOR(S) : Chao Li et al.

It is certified that error appears in the above-identified patent and that said Letters Patent is hereby corrected as shown below:

On the Title Page

Item (72) Inventors, Line 2, delete "Guo-Qiang" and insert --Guo Qiang--.

Item (56) References Cited, FOREIGN PATENT DOCUMENTS, Line 2, delete "CN 2018124394 A" and insert --JP 2018124394 A--.

Item (56) References Cited, OTHER PUBLICATIONS, Line 1, delete "Patenability" and insert --Patentability--.

In the Claims

In Column 13, Line 37, in Claim 1, delete "clap" and insert --gap--.

In Column 15, Line 22, in Claim 15, delete "photonics" and insert --photonic--.

Signed and Sealed this
Sixteenth Day of July, 2024

Katherine Kelly Vidal
*Director of the United States Patent and Trademark Office*